United States Patent
Brault et al.

(10) Patent No.: US 11,217,663 B2
(45) Date of Patent: Jan. 4, 2022

(54) SEMICONDUCTOR HETEROSTRUCTURES WITH WURTZITE-TYPE STRUCTURE ON ZNO SUBSTRATE

(71) Applicant: CENTRE NATIONAL DE LA RECHERCHE SCIENTIFIQUE, Paris (FR)

(72) Inventors: Julien Brault, Antibes (FR); Mohamed Al Khalfioui, Nice (FR); Benjamin Damilano, Nice (FR); Jean-Michel Chauveau, Mougins (FR)

(73) Assignee: CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 16/349,586

(22) PCT Filed: Nov. 15, 2017

(86) PCT No.: PCT/EP2017/079275
§ 371 (c)(1),
(2) Date: May 13, 2019

(87) PCT Pub. No.: WO2018/091502
PCT Pub. Date: May 24, 2018

(65) Prior Publication Data
US 2019/0280085 A1    Sep. 12, 2019

(30) Foreign Application Priority Data

Nov. 18, 2016  (FR) ........................................ 1661191

(51) Int. Cl.
*H01L 29/04*    (2006.01)
*H01L 21/02*    (2006.01)
(Continued)

(52) U.S. Cl.
CPC ........ *H01L 29/045* (2013.01); *H01L 21/0243* (2013.01); *H01L 21/0254* (2013.01);
(Continued)

(58) Field of Classification Search
CPC ............. H01L 29/045; H01L 21/02554; H01L 21/02598; H01L 21/02609; H01L 29/267;
(Continued)

(56) References Cited

U.S. PATENT DOCUMENTS

2003/0213428 A1* 11/2003 Lu ......................... H01J 1/3044
                                                                 117/104
2009/0087937 A1*  4/2009 Kim .................... H01L 21/0242
                                                                 438/46
(Continued)

FOREIGN PATENT DOCUMENTS

FR    3 031 834 A1     7/2016
JP    2005-75651 A     3/2005
WO    2015/177220 A1  11/2015

OTHER PUBLICATIONS

Lim, et al., "Surface and bulk thermal annealing effects on ZnO crystals", Applied Surface Science, vol. 254, Issue 8, pp. 2396-2400, Feb. 15, 2008.
(Continued)

*Primary Examiner* — Thanh Y. Tran
(74) *Attorney, Agent, or Firm* — BakerHostetler

(57) ABSTRACT

A process for fabricating a heterostructure made of semiconductor materials having a crystalline structure of wurtzite type, includes the following steps: structuring a surface of a zinc oxide monocrystalline substrate into mesas; depositing by epitaxy at least one layer of semiconductor materials having a crystalline structure of wurtzite type, forming the heterostructure, on top of the structured surface. Heterostructure obtained by such a process. A process for fabri-
(Continued)

cating at least one electronic or optoelectronic device from such a heterostructure is also provided.

12 Claims, 3 Drawing Sheets

(51) Int. Cl.
*H01L 29/20* (2006.01)
*H01L 29/22* (2006.01)
*H01L 29/267* (2006.01)
*H01L 33/16* (2010.01)
*H01L 33/00* (2010.01)
*H01L 33/32* (2010.01)

(52) U.S. Cl.
CPC .. *H01L 21/02403* (2013.01); *H01L 21/02554* (2013.01); *H01L 21/02565* (2013.01); *H01L 21/02598* (2013.01); *H01L 21/02609* (2013.01); *H01L 29/2003* (2013.01); *H01L 29/2203* (2013.01); *H01L 29/267* (2013.01); *H01L 33/007* (2013.01); *H01L 33/16* (2013.01); *H01L 33/32* (2013.01)

(58) Field of Classification Search
CPC ............. H01L 29/2003; H01L 29/2203; H01L 21/0243; H01L 21/02403; H01L 33/16; H01L 21/02565
See application file for complete search history.

(56) References Cited

U.S. PATENT DOCUMENTS

| | | | |
|---|---|---|---|
| 2009/0114933 A1* | 5/2009 | Osawa | H01L 33/22 257/96 |
| 2010/0117070 A1* | 5/2010 | Adekore | H01L 21/02403 257/43 |
| 2011/0003420 A1 | 1/2011 | Chen et al. | |
| 2012/0091433 A1* | 4/2012 | Hsu | H01L 27/153 257/13 |
| 2015/0257234 A1* | 9/2015 | Wang | H05B 33/14 313/499 |

OTHER PUBLICATIONS

Pearton, et al., "Wet Chemical Etching of Wide Bandgap Semiconductors-GaN, ZnO and SiC", ECS Transactions, vol. 6 (2), pp. 501-512, (2007).

Zhang, et al., "High-performance III-nitride blue LEDs grown and fabricated on patterned Si substrates", Journal of Crystal Growth, vol. 298, pp. 725-730, Jan. 2007.

Chauveau, et al., "Benefits of homoepitaxy on the properties of nonpolar (Zn,Mg)O/ZnO quantum wells on a a-plane ZnO substrates", Applied Physics Letters, vol. 97, Issue 8, (2010).

* cited by examiner

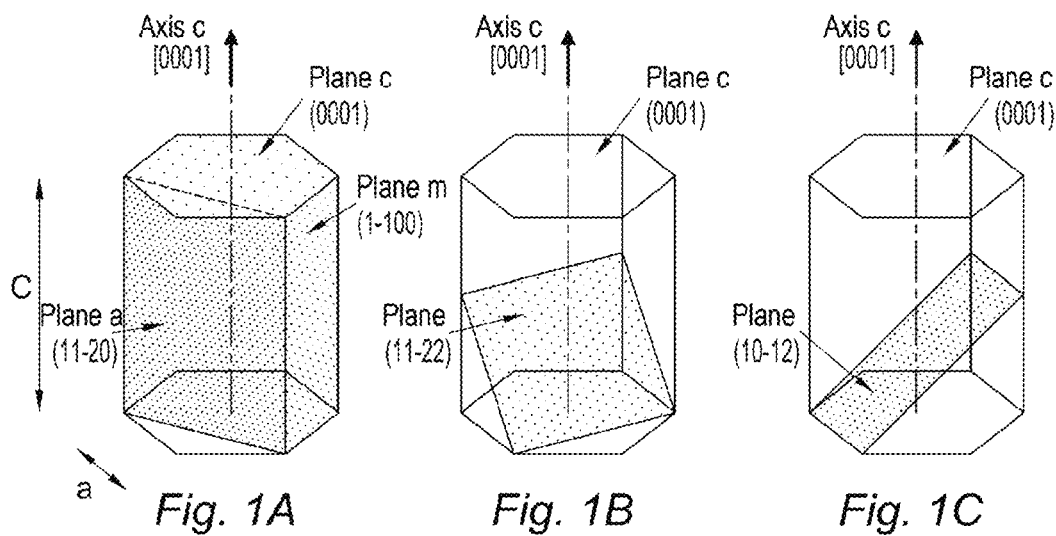
*Fig. 1A*  *Fig. 1B*  *Fig. 1C*
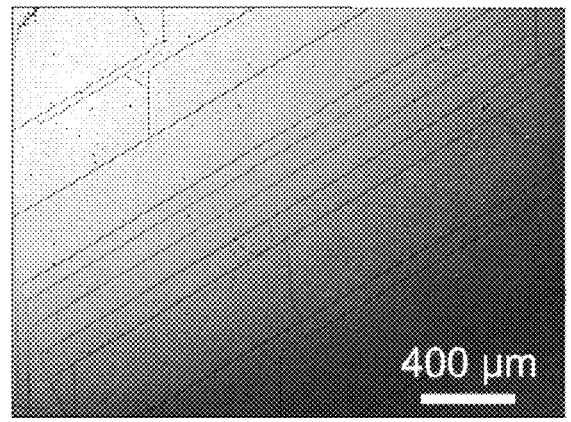
*Fig. 2A*
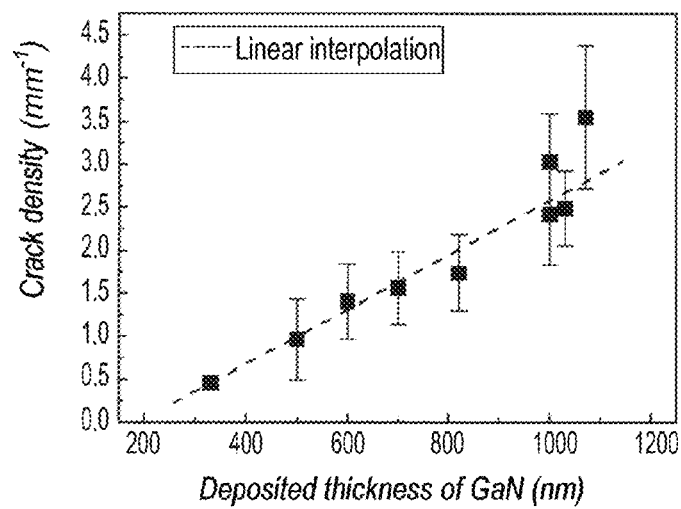
*Fig. 2B*

SEMICONDUCTOR HETEROSTRUCTURES WITH WURTZITE-TYPE STRUCTURE ON ZNO SUBSTRATE

CROSS-REFERENCE TO RELATED APPLICATIONS

This application is a National Stage of International patent application PCT/EP2017/079275, filed on Nov. 15, 2017, which claims priority to foreign French patent application No. FR 1661191, filed on Nov. 18, 2016, the disclosures of which are incorporated by reference in their entirety.

FIELD OF THE INVENTION

The invention relates to a process for fabricating a heterostructure made of semiconductor materials having a crystalline structure of wurtzite type, to a heterostructure of this kind and to the fabrication of electronic or optoelectronic devices starting from a heterostructure of this kind.

BACKGROUND

Semiconductor materials with a wide forbidden band (forbidden band greater than or equal to 3 eV), and notably the nitrides of group III elements (III-N), have undergone considerable development over the last twenty years, notably in the field of optoelectronics. In particular, in the wavelength range from ultraviolet (UV) to the visible, light-emitting diodes (LEDs) and laser diodes (LDs) are commonly used for information signs, lighting, or data storage ("Blu-Ray" technology).

Electronic and optoelectronic devices based on these materials generally comprise a heterostructure formed from layers, called "active", deposited by epitaxy techniques on a single-crystal substrate.

Historically, three substrates have mainly been used: sapphire ($Al_2O_3$), silicon (Si) and silicon carbide (SiC). None of these substrates is completely satisfactory.

Sapphire is currently the material most commonly used for making substrates on which layers of III-N materials will be deposited, notably on account of its ready availability, its window of transparency in the visible and its stability at high temperature (>1500° C.). Furthermore, sapphire allows active layers to be obtained without strain or in compressive stress, which may thereby reach large thicknesses (several tens of micrometers) without cracking. However, this material also has very disadvantageous drawbacks: it is an insulator, so it is not possible to fabricate devices with a vertical structure, and its low thermal conductivity limits the permissible power density of the devices obtained. Furthermore, sapphire has a (rhombohedral) crystalline structure, different from that of the III-N materials (wurtzite), and a large mismatch of lattice parameters. This gives rise to crystal defects in the structures (stacking faults, dislocations, inversions of domains with different polarity, etc.), which makes it impossible to obtain active layers of good structural quality along certain orientations (nonpolar and semipolar) without resorting to complex technological processes, i.e. with several steps in the process (masking, surface preparation, resumption of growth, etc.).

Silicon carbide (SiC) itself has a lattice parameter close to that of many III-N materials, it may be doped intentionally to allow vertical structures to be produced, and it has high thermal conductivity. However, its industrial development is held back by its very high cost relative to sapphire.

Silicon (Si) is favored through its compatibility with the production lines of the microelectronics industry. However, its crystalline structure is not of the "wurtzite" type, but of the "diamond" type, which makes it impossible to obtain active layers of good structural quality with certain orientations. Furthermore, the mismatch of coefficient of thermal expansion with the active layers is very large and may generate tensile stress in the latter and lead to the development of cracks. Growth on Si then requires having recourse to expensive, complex fabrication processes in order to compensate the tensile stress with a compressive stress.

More recently, the use of zinc oxide (ZnO) has been proposed as an alternative to these three materials. In principle, ZnO offers many advantages: it has the same crystalline structure (wurtzite) as the semiconductor materials with a wide forbidden band that we wish to deposit, similar lattice parameters, a small difference in the coefficients of thermal expansion with these materials, relatively high thermal conductivity, and may be doped intentionally. It is also possible to separate it easily from the active layers on account of the great chemical selectivity between the two families of materials: nitrides and oxides. Massive substrates of ZnO are available, with excellent structural properties and an affordable price. Its limitations are mainly connected with its low thermal stability and its high chemical reactivity (for example with ammonia ($NH_3$)), which may lead to surface degradation or even to its decomposition at temperatures typically above 750° C. Furthermore, tensile stresses may develop between ZnO and active layers based on nitrides or oxide.

A crystalline structure of the wurtzite type comprises two types of atoms; each of these two types of atoms forms a sublattice of the hcp (hexagonal close-packed) type. The wurtzite structure is noncentrosymmetric, and is therefore often associated with properties of piezoelectricity and/or pyroelectricity. FIGS. 1A, 1B and 1C schematically illustrate the wurtzite structure and some of its growth planes. The "c" planes (0001) and (000-1) are said to be polar; the "a" plane (11-20) and "m" plane (1-100) are said to be nonpolar; other planes with an angle to the c plane different from 0° and 90° are said to be semipolar (for example the (11-22) and (10-12) planes).

Almost all devices based on semiconductors with wurtzite-type structure with a wide forbidden band are obtained from active layers grown epitaxially on a growth plane of (0001) orientation, and thus along the <0001> direction. These layers then have an internal electric field, denoted by $F_{int}$ hereinafter, which originates from:
1) the noncoincidence between the centroids of the positive and negative charges in the wurtzite structure leading to a so-called "spontaneous" polarization component, very high along the <0001> axis, and
2) the strains connected with the mismatch of lattice parameters of the different materials leading to a so-called "piezoelectric" polarization component.

In a heterostructure, $F_{int}$ may reach several hundreds or even thousands of kV/cm. The optoelectronic properties of the heterostructures are highly dependent on this field, which has deleterious consequences for the functioning of the components: for example, in the case of LEDs and laser diodes (LDs), it leads to a decrease of recombinations of electron-hole pairs and therefore of the radiative efficiency in the quantum wells, as well as to a shift of the radiative transitions to high wavelengths. Moreover, for intersubband devices, this field greatly alters the band structure and the position of the energy levels in the heterostructures and consequently requires complex band engineering during production of the devices. Thus, for the LEDs and LDs emitting in the visible at long wavelengths (>500 nm) and in the ultraviolet at short wavelengths (<350 nm) as well as for the intersubband devices (tunnel effect diodes, electro-optical modulators, photodetectors, quantum cascade components, etc.), it is desirable to eliminate this polarization.

In order to eliminate, or at the very least reduce, the field $F_{int}$ it is possible to use orientations different than the (0001) orientation, for example the nonpolar or semipolar orientations described above with reference to FIGS. 1A-1C. However, active layers of polar or semipolar orientation deposited on a sapphire, SiC or Si substrate generally have very high defect densities, unless we resort to complex and therefore expensive fabrication processes.

One of the main advantages of ZnO as a substrate for depositing active layers of semiconductor materials having a structure of the wurtzite type is precisely that it allows the use of these nonpolar or semipolar orientations, and at a modest cost as massive substrates of ZnO having these orientations are commercially available with excellent structural properties and at an affordable price. Thus, several research groups, including that of the inventors, have already published results concerning the growth of active layers with nonpolar and semipolar orientations on ZnO substrates of orientation (11-20) "plane a", (1-100) "plane m" or (10-12). See for example:

J. M. Chauveau, M. Teisseire, H. Kim-Chauveau, C. Deparis, C. Morhain, B. Vinter, "Benefits of homoepitaxy on the properties of nonpolar (Zn,Mg)O/ZnO quantum wells on a-plane ZnO substrates", Appl. Phys. Lett. 97 (2010) 081903;

J. M. Chauveau, Y. Xia, I. Ben Taazaet-Belgacem, M. Teisseire, B. Roland, M. Nemoz, J. Brault, B. Damilano, M. Leroux, B. Vinter, "Built-in electric field in ZnO based semipolar quantum wells grown on (101-2) ZnO substrates", J Appl. Phys. Lett. 103 (2013) 262104.

Document WO 2015/177220 proposes to reduce the crystal defects appearing during epitaxy of the element-III nitride, by carrying out this epitaxy on the inclined flanks of the valleys that produce the surface structure of the zinc oxide substrate. However, this does not allow the same plane of orientation to be preserved between the substrate and the element-III nitride.

The authors of document FR 3031834 propose to reduce these crystal defects by using a buffer layer comprising aluminum nitride between the substrate and gallium nitride. However, the lattice parameters of aluminum nitride and zinc oxide are different, which degrades the crystal quality of the assembly. It is therefore necessary to deposit a sufficiently thick layer of gallium nitride to compensate this degradation.

Document US 2010/0117070 presents a light-emitting device comprising semiconductor materials. This device is made on a zinc oxide substrate, on which a reflective structured layer is deposited. This structured layer is intended to improve the extraction of light inside the device. The characteristic dimensions of the structuring therefore depend on the desired refractive indices and on the emission wavelengths of the device.

SUMMARY OF THE INVENTION

The invention aims to improve the structural, electronic and optoelectronic properties of heterostructures of semiconductor materials, notably with a wide forbidden band, having a crystalline structure of wurtzite type produced on a ZnO substrate, with a polar, nonpolar or semipolar orientation.

In fact, although the lattice parameters between ZnO and the proposed active layers are close, there is nearly always a parameter mismatch between the substrate and the epitaxial layer. In particular, this mismatch is positive in the case of GaN, AlN, as well as the alloys (Al,Ga)N or (Zn,Mg)O, i.e. the values $\Delta a/a_{CA}$ and $\Delta c/c_{CA}$ with $\Delta a_{substrate} - a_{CA}$ and/or $\Delta c = c_{substrate} - c_{CA}$ are greater than 0, with the subscript "CA" indicating the parameter of the active layer; the crystal parameters "a" and "c" are identified in FIG. 1A. The inventors realized that this stress induces a mechanism of plastic relaxation of the stressed epitaxial layer, which may occur through various processes such as cracking, generation of interface dislocations, etc. This results in defects that degrade the electrical and/or optoelectronic properties of the heterostructure. The invention makes it possible to avoid this degradation.

According to the invention, this aim is achieved by three-dimensional structuring into "mesas" of the surface of the ZnO substrate, having a flat surface, which allows elastic relaxation of the stress in the active layers, owing to the presence of free edges. The mesas have lateral dimensions—or at least one lateral dimension—that may reach some hundreds of micrometers, or even about a millimeter, and each mesa may correspond to an electronic or optoelectronic device produced starting from the heterostructure. They also have a flat upper surface parallel to the surface of the substrate, as well as lateral surfaces that are vertical or inclined relative to the latter.

The principle of mesa structuring of a substrate has already been used for epitaxy of nitrides of group III elements on silicon substrates: see the article by Baoshun Zhang, Hu Liang, Yong Wang, Zhihong Feng, Kar Wei Ng, Kei May Lau, "High-performance III-nitride blue LEDs grown and fabricated on patterned Si substrates", J. Crystal Growth 298, 725 (2007). It should however be emphasized that the mechanism of appearance and relaxation of stresses is different for Si and ZnO substrates. In the first case, the appearance of defects is the consequence of the differences in coefficients of thermal expansion between the active layers and the substrate. This mechanism is therefore involved during the cooling phase that follows the epitaxial growth phase. However, in the case of active layers on ZnO, the appearance of defects is the consequence of the parameter mismatches of the unit cells and therefore occurs during the stage of epitaxial growth.

The invention therefore relates firstly to a process for fabricating a heterostructure made of semiconductor materials having a crystalline structure of wurtzite type, comprising the following steps:

structuring a surface of a single-crystal zinc oxide substrate in mesas; and epitaxial deposition of at least one layer of semiconductor material having a crystalline structure of wurtzite type, forming said heterostructure, on top of the structured surface.

According to particular embodiments of such a method:

Said mesas may have a smaller lateral dimension between 10 and 1000 µm and a height greater than or equal to 100 nm.

Said structuring step may be carried out by chemical etching.

The process may also comprise a step of heat treatment of the structured surface of said substrate by annealing under an oxygen stream at a temperature greater than or equal to 600° C., carried out before said step of epitaxial deposition of at least one layer of semiconductor material having a crystalline structure of wurtzite type.

Said step of epitaxial deposition of at least one layer of semiconductor material having a crystalline structure of wurtzite type may be carried out by molecular beam epitaxy.

The process may also comprise a step of depositing a thin protective layer on at least one surface of said substrate other than the structured surface, carried out before said step of epitaxial deposition of at least one layer of semiconductor material having a crystalline structure of wurtzite type.

The structured surface may have a nonpolar or semipolar orientation.

Said or each said layer of semiconductor material having a crystalline structure of wurtzite type may comprise at least one material selected from a binary nitride, a binary oxide, a Zn(Mg,Cd)O alloy and an Al(Ga,In)N alloy.

The invention relates secondly to a process for fabricating at least one electronic or optoelectronic device comprising:
fabrication of a heterostructure of at least one semiconductor material having a crystalline structure of wurtzite type by a process as mentioned above;
fabrication of said electronic or optoelectronic device starting from a region of said heterostructure corresponding to a mesa of the structured surface of the substrate.

The invention relates thirdly to a heterostructure comprising at least one layer of semiconductor material having a crystalline structure of wurtzite type, deposited on top of a surface of a single-crystal substrate of zinc oxide, characterized in that said surface is structured as mesas.

According to particular embodiments of a heterostructure of this kind:
Said mesas may have a smaller lateral dimension between 10 and 1000 μm and a height greater than or equal to 100 nm.

The structured surface of said substrate may have a nonpolar or semipolar orientation.

Said or each said layer of semiconductor material having a crystalline structure of wurtzite type may comprise at least one material selected from a binary nitride, a binary oxide, a Zn(Mg,Cd)O alloy and an Al(Ga,In)N alloy.

BRIEF DESCRIPTION OF THE DRAWINGS

Other features, details and advantages of the invention will become clearer on reading the description, referring to the appended drawings given as an example, in which:

FIGS. 1A, 1B and 1C, already described, show the structure of wurtzite type and some of its crystal planes;

FIGS. 2A and 2B illustrate crack formation during epitaxial growth of layers of GaN on a ZnO substrate;

DETAILED DESCRIPTION

FIGS. 2A and 2B highlight the problem—not clearly identified in the prior art—for which the present invention supplies a solution. FIG. 2A is an image of a 1.1-μm thick layer of GaN grown epitaxially on a ZnO substrate plane c ((0001) orientation, polar). Cracks can be seen that are mainly oriented along the <11-20> directions. As was explained above, these cracks are caused by the tensile stresses induced by the positive parameter mismatch between the ZnO substrate and the layer of GaN grown epitaxially. More generally, this effect is observed in (Al,Ga)N and (Zn,Mg)O alloys.

The cracks appear once the thickness of the epitaxially-grown layer exceeds a critical value; they are propagated from the surface to the substrate through the layer. As the relaxation criterion is the elastic energy stored during growth, the number of cracks per unit area of the layer will increase with the thickness and the initial strain, regardless of the nature of the epitaxially-grown layer. FIG. 2B is a graph of crack density as a function of the layer thickness. It can be seen that the critical thickness is of the order of 300 nm for the GaN/ZnO system, and that crack density increases with the thickness of GaN, beyond this value. The consequence of these mechanisms of stress relaxation is that, in the case of LED structures for example, whose thickness is typically between 2 and 5 μm, very high crack densities are observed. These cracks notably make planar technology impossible (the LED technology most commonly used) as they prevent lateral passage of the electric current. Furthermore, if the metal used for the electrical contacts is deposited in the cracks, the active zone of the diodes may be short-circuited.

FIGS. 3A-3E illustrate the different steps of a process according to one embodiment of the invention, making it possible to prevent the appearance of these cracks.

Figures 3A, 3B, 3C:
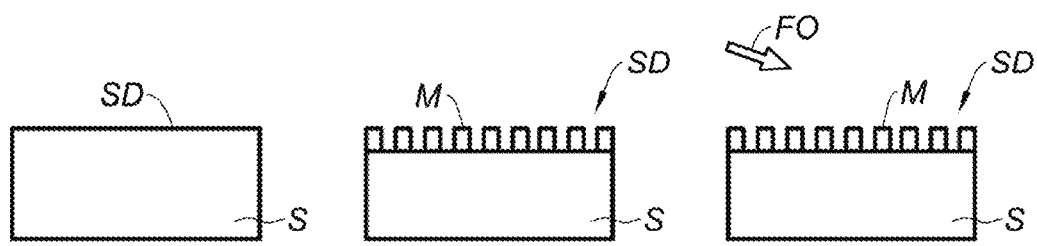
FIGS. 3A-3E show different steps of a process according to one embodiment of the invention.

FIG. 3A shows a planar substrate S of ZnO, having a surface SD on which layers of semiconductor materials with a wurtzite-type structure are to be grown epitaxially. The orientation of this surface SD may be polar, semipolar or nonpolar.

The first step of the process, illustrated in FIG. 3B, consists of structuring the surface SD with three-dimensional patterns M in the form of mesas. These patterns will give rise to elastic relaxation of the epitaxially-grown layers, which makes it possible to prevent plastic relaxation of the stress in the active layers. This elastic relaxation is made possible owing to the possibility of relaxation of the layers at the edge of the mesas M.

The structuring of the ZnO may be carried out by wet etching or dry etching, or even a combination of the two methods. One advantage of ZnO is the possibility of being able to use simple wet etching processes, in general using a greatly diluted acid solution. For example, it was shown that ZnO could be etched efficiently in greatly diluted solutions such as $HNO_3/HCl$, $HF/HNO_3$, as well as in non-acid solutions such as acetyl acetone. See for example the article by J. Pearton, J. J. Chen, W. T. Lim, F. Ren and D. P. Norton, "Wet Chemical Etching of Wide Bandgap Semiconductors-GaN, ZnO and SiC", ECS Transactions, 6 (2) 501-512 (2007).

The patterns are defined using a mask, typically of photosensitive resin or of metal, which is removed after the etching step. They may be square, circular, rectangular or in the form of diamonds or elongated strips in one of the directions of the plane. Their lateral dimensions may vary from 100 nanometers to some centimeters in the case of elongated strips; however, for efficient stress relaxation it is necessary that the smallest lateral dimension does not exceed some hundreds of micrometers, or even some millimeters. The use of patterns with dimensions smaller than some micrometers is possible, but is not readily compatible with the fabrication of electronic or optoelectronic components. Thus, the patterns will preferably have a smaller lateral dimension between 10 and 1000 µm.

The depth of etching (and therefore the height of the mesas) must be greater than the thickness of the active layers. Typically, it may vary from 100 nm to several tens of micrometers.

Figure 4:
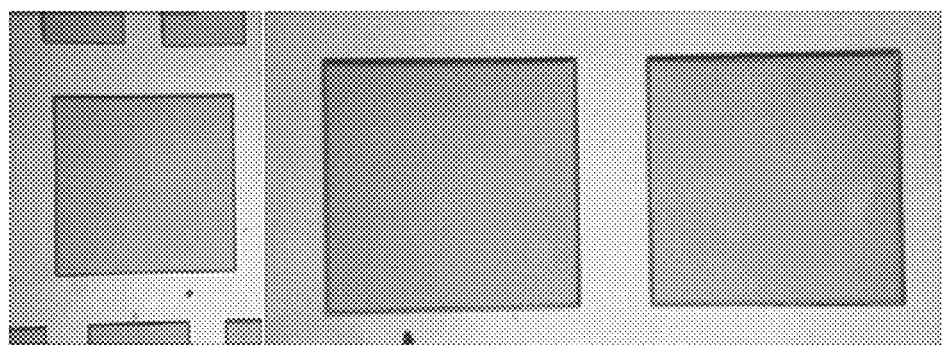
FIG. 4 shows electron microscopy images of a structured surface of a ZnO substrate according to one embodiment of the invention.

FIG. 4 shows light-microscope images of the surface of a ZnO substrate (plane c) structured with square mesas with a side of some hundreds of µm (460 µm for the image on the left and 315 µm for the image on the right) and some micrometers high, obtained by wet etching using a solution of $H_3PO_4$ greatly diluted in water, with a ratio $2(H_3PO_4)/100(H_2O)$, in order to limit lateral etching.

After the structuring step, the surface of the substrate undergoes an operation of preparation by heat treatment at a temperature equal to at least 600° C. (or even 800° C.) and under an oxygen stream FO (FIG. 3C). This heat treatment may be preceded by cleaning of the surface using an oxygen-based plasma. After this second step, atomic steps are obtained at the surface of the patterns.

Figures 5A, 5B:
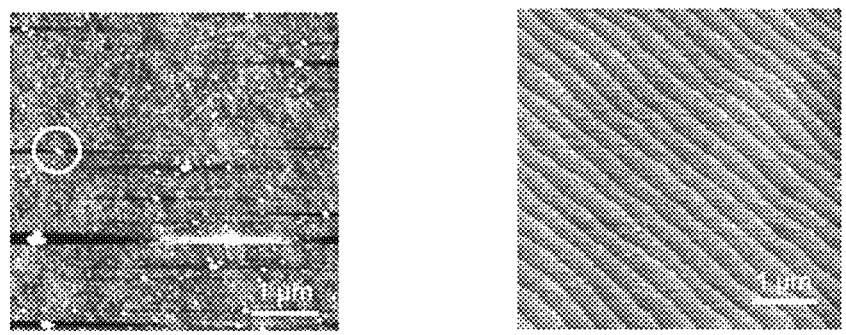
FIGS. 5A and 5B show the effect of a step of heat treatment of a process according to one embodiment of the invention.

FIGS. 5A and 5B are images, obtained with the atomic force microscope, of the surface of a ZnO substrate (plane c) before (5A) and after (5B) an annealing heat treatment at a temperature of 1000° C. for 2 minutes under an oxygen stream. Before the treatment, the surface is not smooth at the atomic scale, it is streaked and still has polishing residues (silica particles, one of which has been highlighted by putting a circle round it). After the treatment, these scratches and contaminations have disappeared and the atomic steps can be seen clearly.

Figures 3D, 3E:
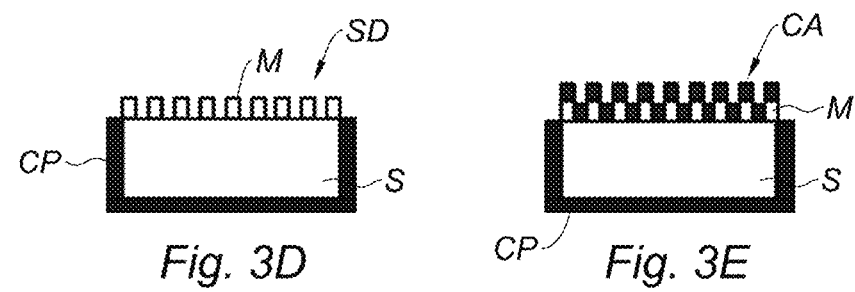

Next, it is possible to protect the surfaces of the substrate on which growth is not envisaged by depositing a thin layer CP (FIG. 3D). These surfaces comprise the back and the lateral faces of the ZnO substrate. This thin layer may be an oxide (for example $SiO_2$) or a refractory nitride (for example $Si_3N_4$). Deposition is carried out for example by cathode sputtering, prior to growth of the active layers. It is possible to use epitaxial growth techniques such as metal-organic vapor phase epitaxy (also known by the acronym MOCVD, for "Metal-Organic Chemical Vapor Deposition") and hydride vapor phase epitaxy (HVPE). In fact, MOCVD is the technique currently used on an industrial scale for making devices based on GaN. HVPE is also used for fabricating (pseudo-)substrates of GaN on account of the very high growth rates (of the order of 100 µm/h).

FIG. 3E illustrates, very schematically, the structure obtained after epitaxial deposition, directly on the structured surface of the substrate, of one or more active layers CA. More precisely, these layers are deposited directly—without interposing a buffer layer of a different material—on the flat upper surfaces of the mesas (in contrast to document FR3031834 here a buffer layer of AlN must necessarily be inserted prior to epitaxy of the active layers CA); they therefore have the same crystal orientation as the ZnO substrate. These discontinuous layers have free edges, corresponding to the edges of the mesas M of the substrate, which allows relaxation of the stresses. Note that the active layers are also deposited in the furrows separating the mesas; however, these portions of the active layers are not used.

As was mentioned above, the active layers may be deposited by techniques such as MOCVD or HVPE. According to a preferred embodiment of the invention, however, molecular beam epitaxy (MBE) is used instead. This growth technique is advantageous as it allows growth of nitride materials at much lower temperatures (from 300 to 400° C. lower) than those used in MOCVD, which reduces the risks of thermal decomposition of the ZnO. Furthermore, it makes it possible to use $N_2$ instead of ammonia ($NH_3$) as the source of nitrogen using a plasma cell RF, which is not possible when using MOCVD as the growth technique. Now, ZnO is very reactive with respect to ammonia. Moreover, this growth technique also makes it possible to grow ZnO/(Zn, Mg)O structures, which have the lowest residual doping.

Figure 6A:
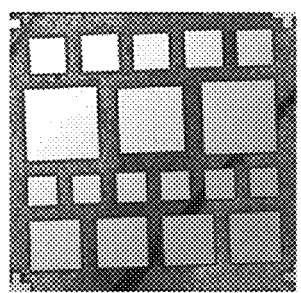
FIGS. 6A and 6B show electron microscopy images of a layer of GaN grown epitaxially on a structured surface of a ZnO substrate according to one embodiment of the invention.
Figure 6B:
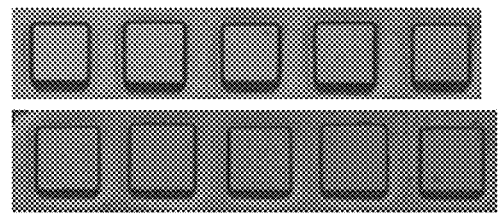

The principle of the invention was validated by performing growth by MBE of active layers of GaN on structured ZnO substrates. FIGS. 6A and 6B show light-microscope images of the structures obtained for two different crystallographic orientations: plane c (0001)—6A—and plane m (1-100)—6B. The thickness of the active layer is 0.7 µm and 0.6 µm, respectively. Absence of cracks is confirmed in both cases, even though the thickness deposited is much greater than the critical cracking thickness (cf. FIG. 2B). These results clearly demonstrate the principle of the invention and its adaptability for growing materials with a wurtzite-type structure stressed in the various crystallographic orientations, allowing it to be extended to nonpolar and semipolar heterostructures of large thicknesses.

Figure 7A:
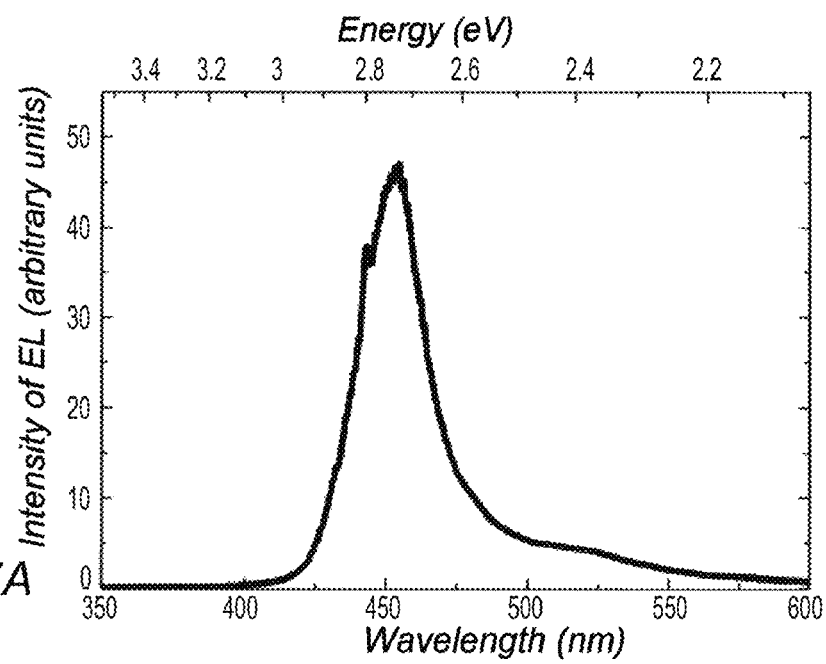
FIGS. 7A-7B illustrate a technical result of the invention.

LEDs having a square geometry with mesas with a size between 140 and 460 µm have also been fabricated starting from (In,Ga)N/GaN heterostructures produced according to the invention. Each LED corresponds to a mesa of the structured substrate. FIG. 7A shows an electroluminescence spectrum obtained at room temperature for a polar LED of this kind with active layers—with (0001) or (000-1) orientation—based on GaN—more precisely, it is an (In,Ga)N/GaN quantum well LED—with a side of 400 µm and an injection current of 20 mA. The spectrum in FIG. 7A is dominated by a peak emitting in the blue around 455 nm. This blue emission originates from recombination of the carriers in the (In,Ga)N/GaN quantum wells, confirming that the fabrication of monolithic structures of LEDs based on GaN on structured ZnO substrates has been carried out successfully.

Figure 7B:
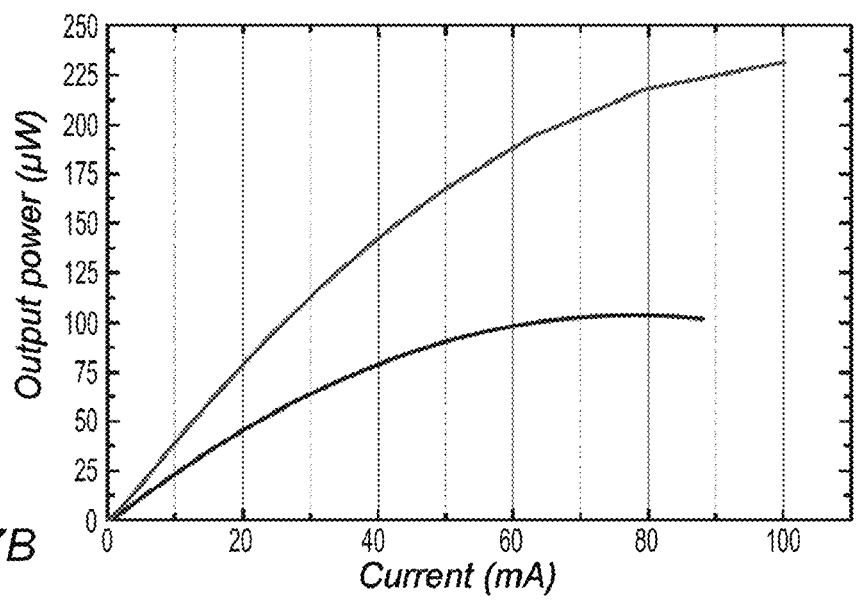

The performance of these LEDs was compared with that of identical devices, but made on an unstructured ZnO substrate. FIG. 7B is a graph of the output optical power of the LEDs as a function of the injection current; the gray curve corresponds to the devices according to the invention, and the black curve corresponds to those produced on an unstructured substrate. It can be seen that the invention can give a great improvement in optical power, by at least a factor of 2 at 20 mA (from 40 to 80 µW) and 80 mA (from 105 to 220 µW).

The applications of the invention mainly relate to the fabrication of microelectronic and optoelectronic components, and more particularly LEDs, lasers, transistors with high electronic mobility or power transistors, quantum well photodetectors in the near and far infrared (QWIP, for quantum well infrared photodetector), but also quantum cascade components (lasers and detectors) that require very large thicknesses of active layers.

Moreover, the invention makes it possible to take advantage of the very high selectivity of etching of ZnO relative to the active layers to allow the production of microstructures (membranes, microdisks, etc.) suitable for the fabrication of microcomponents for electronics and photonics. For example, it is possible to fabricate a suspended structure formed by a layer of GaN previously grown epitaxially on a ZnO substrate, and then sub-etched chemically with an acid solution (for example $H_3PO_4$) greatly diluted in water. It is thus possible to produce photonic crystals or metal/ metal guides by selective removal of the substrate followed by transfer onto another substrate.

The invention claimed is:

1. A process for fabricating a heterostructure made of semiconductor materials having a crystalline structure of wurtzite type, comprising the following steps:
   structuring a surface of a single-crystal substrate into mesas;
   wherein said substrate and said mesas are both made of zinc oxide,
   wherein said substrate has a flat surface,
   and wherein said mesas have a flat upper surface parallel to said surface of said substrate;
   heating said structured surface of said substrate by annealing under an oxygen stream at a temperature greater than or equal to 600° C.; and
   depositing by epitaxy at least one layer of semiconductor material having said crystalline structure of wurtzite type, forming said heterostructure, directly on the flat upper surface of said mesas of said structured and thermally treated surface.

2. The process as claimed in claim 1, wherein said mesas have a smaller lateral dimension between 10 and 1000 μm and a height greater than or equal to 100 nm.

3. The process as claimed in claim 1, wherein said mesas are made by etching the surface of the single-crystal substrate.

4. The process as claimed in claim 1, wherein said step of said depositing by epitaxy the at least one layer of semiconductor material having said crystalline structure of wurtzite type is carried out by molecular beam epitaxy.

5. The process as claimed in claim 1, further comprising a step of depositing a thin protective layer on at least one surface of said substrate other than the structured surface, carried out before a step of said depositing by epitaxy the at least one layer of semiconductor material having said crystalline structure of wurtzite type.

6. The process as claimed in claim 1, wherein the structured surface has a nonpolar or semipolar orientation.

7. The process as claimed in claim 1, wherein said at least one layer of semiconductor material having said crystalline structure of wurtzite type comprises at least one material selected from a binary nitride, a binary oxide, a Zn(Mg, Cd)O alloy and an Al(Ga, In)N alloy.

8. A process for fabricating at least one electronic or optoelectronic device comprising:
   fabricating a heterostructure in at least one semiconductor material having a crystalline structure of wurtzite type, wherein said fabricating of said heterostructure comprises:
      structuring a surface of a single-crystal substrate into mesas,
      wherein said substrate and said mesas are both made of zinc oxide,
      wherein said substrate has a flat surface, and
      wherein said mesas have a flat upper surface parallel to said surface of said substrate;
   heating said structured surface of said substrate by annealing under an oxygen stream at a temperature greater than or equal to 600° C.;
   depositing by epitaxy at least one layer of semiconductor material having said crystalline structure of wurtzite type, forming said heterostructure, directly on the flat upper surface of said mesas of said structured and thermally treated surface; and
   fabricating said at least one electronic or optoelectronic device starting from a region of said heterostructure corresponding to said mesa of said structured and thermally treated surface of said substrate.

9. A heterostructure comprising at least one layer of semiconductor material having a crystalline structure of wurtzite type, deposited directly on top of a surface of a single-crystal substrate, wherein said surface is structured as mesas and has a flat surface, wherein said surface is thermally treated, wherein said single-crystal substrate and said mesas are both made of zinc oxide, said mesas having a flat upper surface parallel to said surface of the substrate, the at least one layer of semiconductor material being deposited by epitaxy directly on the flat upper surface of the mesas, wherein each deposited layer of semiconductor material having free lateral edges in order to relax the mechanical stresses in said deposited layer of semiconductor material.

10. The heterostructure as claimed in claim 9, wherein said mesas have a smaller lateral dimension between 10 and 1000 μm and a height greater than or equal to 100 nm.

11. The heterostructure as claimed in claim 9, wherein the structured surface of said substrate has a nonpolar or semipolar orientation.

12. The heterostructure as claimed in claim 9, wherein said at least one layer of semiconductor material having said crystalline structure of wurtzite type comprises at least one material selected from a binary nitride, a binary oxide, a Zn(Mg,Cd)O alloy and an Al(Ga,In)N alloy.

* * * * *